(12) United States Patent
Mok et al.

(10) Patent No.: US 7,901,985 B2
(45) Date of Patent: Mar. 8, 2011

(54) METHOD FOR MANUFACTURING PACKAGE ON PACKAGE WITH CAVITY

(75) Inventors: Jee-Soo Mok, Yongin-si (KR);
Chang-Sup Ryu, Yongin-si (KR);
Dong-Jin Park, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/585,235

(22) Filed: Sep. 9, 2009

(65) Prior Publication Data

US 2010/0022052 A1   Jan. 28, 2010

Related U.S. Application Data

(62) Division of application No. 11/706,223, filed on Feb. 15, 2007, now Pat. No. 7,605,459.

(30) Foreign Application Priority Data

Feb. 16, 2006 (KR) .................. 10-2006-0014917

(51) Int. Cl.
*H01L 21/00* (2006.01)

(52) U.S. Cl. .................. 438/107; 438/108; 257/686

(58) Field of Classification Search .................. None
See application file for complete search history.

(56) References Cited

U.S. PATENT DOCUMENTS

| 4,288,841 | A | * | 9/1981 | Gogal | 361/792 |
|---|---|---|---|---|---|
| 5,327,325 | A | | 7/1994 | Nicewarner, Jr. | |
| 5,646,828 | A | * | 7/1997 | Degani et al. | 361/715 |
| 6,180,881 | B1 | * | 1/2001 | Isaak | 174/524 |
| 6,313,522 | B1 | | 11/2001 | Akram et al. | |
| 6,542,393 | B1 | * | 4/2003 | Chu et al. | 365/51 |
| 7,528,474 | B2 | * | 5/2009 | Lee | 257/686 |
| 7,727,799 | B2 | * | 6/2010 | Lin | 438/106 |
| 2007/0216008 | A1 | * | 9/2007 | Gerber | 257/686 |
| 2009/0115049 | A1 | * | 5/2009 | Shiraishi et al. | 257/698 |
| 2010/0240175 | A1 | * | 9/2010 | Hong | 438/109 |

FOREIGN PATENT DOCUMENTS

KR    1993-0017160    8/1993

(Continued)

OTHER PUBLICATIONS

Korean Patent Office Action, mailed Oct. 26, 2006 and issued in Korean Patent Application No. 10-206-0014917 cited Korean Patent Publication Nos. 1993-0017160 (Reference AG) and 10-0259450 (Reference AH).

(Continued)

*Primary Examiner* — Jarrett J Stark
*Assistant Examiner* — Nicholas Tobergte (57) ABSTRACT

A manufacturing method of a package on package with a cavity. The method can include forming a first upper substrate cavity in one side of an upper substrate; mounting an upper semiconductor chip on the other side of the upper substrate; forming a lower substrate cavity in one side of a lower substrate; mounting a lower semiconductor chip in the lower substrate cavity formed in the lower substrate; and stacking the upper substrate above the lower substrate such that the first upper substrate cavity accommodates a part of the lower semiconductor chip. The package on package and a manufacturing method thereof can reduce the overall thickness of the package by forming cavities in both upper and lower substrates to accommodate a semiconductor chip mounted in the lower substrate.

6 Claims, 6 Drawing Sheets

FOREIGN PATENT DOCUMENTS

KR          10-0259450          3/2000

OTHER PUBLICATIONS

U.S. Appl. No. 11/706,223, filed Feb. 15, 2007, Jee-Soo Mok et al., Samsung Electro-Mechanics Co., Ltd.
Korean Office Action, dated Oct. 26, 2007, issued in priority Korean Application No. 10-2006-0014917.
Chinese Patent Office Action, mailed Mar. 21, 2008 and issued in corresponding Chinese Patent Application No. 200710079522.5.
U.S. Patent Office Action, mailed Jun. 25, 2008, issued in corresponding U.S. Appl. No. 11/706,223.
U.S. Patent Office Action, mailed Nov. 6, 2008, issued in corresponding U.S. Appl. No. 11/706,223.
U.S. Patent Notice of Allowance, mailed Jun. 11, 2009, issued in corresponding U.S. Appl. No. 11/706,223.

* cited by examiner

METHOD FOR MANUFACTURING PACKAGE ON PACKAGE WITH CAVITY

CROSS-REFERENCE TO RELATED APPLICATIONS

This application is a U.S. divisional application filed under 35 USC 1.53(b) claiming priority benefit of U.S. Ser. No. 11/706,223 filed in the United States on Feb. 15, 2007, now U.S. Pat. No. 7,605,459 which claims earlier priority benefit to Korean Patent Application No. 10-2006-0014917 filed with the Korean Intellectual Property Office on Feb. 16, 2006, the disclosures of which are incorporated herein by reference.

BACKGROUND

1. Field

The present invention relates to a stacked-type semiconductor package module, more specifically to a package on package with a cavity, and a manufacturing method thereof.

2. Description of the Related Art

With the development of the electronics industry, there has been increasing demands for electronic parts that perform better and are smaller. To accommodate these demands, the semiconductor packing technologies have been evolving from packing one integrated circuit on one substrate to packing several integrated circuits on one substrate. Moreover, to address the need for realizing high-performance, high-density packages, and to meet the demand for these packages, the "package on package (POP)" technology has been introduced. However, minimizing the thickness of the package has been a challenge to overcome for successful implementation of the POP technology.

Figure 1:
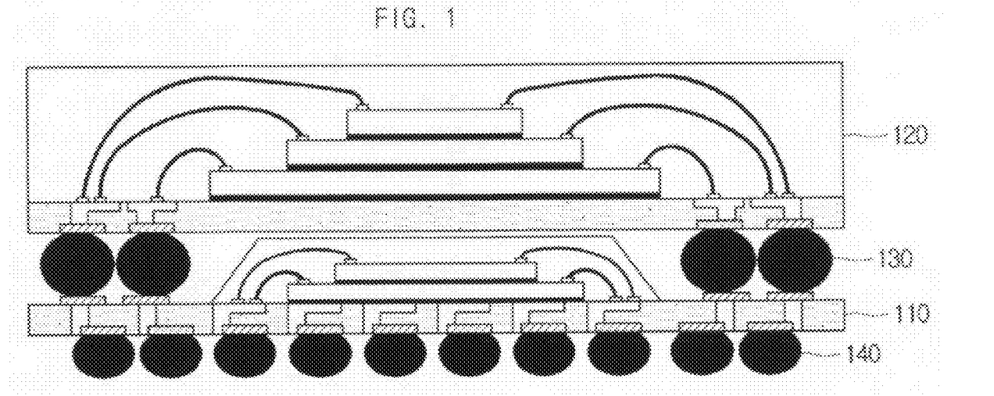
FIG. 1 is a sectional view of a conventional package on package.

FIG. 1 is a sectional view of a conventional package on package. FIG. 1 shows a lower package 110, an upper package 120, an upper solder ball 103, and a lower solder ball 140.

The conventional ball grid array (BGA) semiconductor package has a substrate body, in which a plurality of patterned conductive wires are installed. On top of the substrate body are a plurality of chip pads, to which semiconductor chips are wire-bonded. In addition, some area of the top of the substrate body is molded with an epoxy compound and forms a molding part, such that the semiconductor chip and metal wire are enveloped. Adhered to the bottom of the substrate are a plurality of solder balls such that the other ends of the conductive wires installed in the substrate can be connected. This structure of a conventional ball grip array semiconductor package is too thick to be stacked as a highly integrated memory module within a limited area.

The lower package 110 of the conventional package on package has a dual-level structure, and an integrated circuit is mounted on the surface of this substrate. The substrate of the lower package 110 is manufactured in the same method as manufacturing a general printed circuit board. The increasing density in the semiconductor package module necessitates the mounting of a plurality of integrated circuits. With the conventional method, it is difficult to increase the mounting in the lower package 110 while maintaining the overall height of the package on package. The die-thinning method, which reduces the thickness of a semiconductor chip, can be one way of reducing the height, but this raises the issue of function-error with a prolonged operation. Therefore, improvement in mounting capacity of the package on package is attempted by reducing the thickness of the substrate.

The overall thickness of the package can be reduced by forming a cavity in the lower package 110 for mounting the semiconductor chip within, but there is a limit to how much the thickness can be reduced. Therefore, it has been required to reduce the thickness of the package by processing the upper package 120.

SUMMARY

The present invention provides a package on package with a cavity and a manufacturing method thereof which allow a plurality of semiconductor chips to be mounted by reducing the thickness of a substrate.

And, the present invention provides a package on package with a cavity and a manufacturing method thereof which can reduce the overall thickness of the semiconductor package by mounting the semiconductor chip in the cavity.

Also, the present invention provides a package on package with a cavity and a manufacturing method thereof which can reduce the thickness of the package without decreasing the number of mounted integrated circuits, by accommodating the semiconductor chip in the cavity.

In addition, the present invention provides a package on package with a cavity and a manufacturing method thereof that allow a plurality of semiconductor chips to be mounted in layers in a lower package.

Moreover, the present invention provides a package on package with a cavity and a manufacturing method thereof which can reduce the thickness of a substrate for a package on package having at least three layers.

Furthermore, the present invention provides a package on package with a cavity and a manufacturing method thereof which can reduce the overall thickness of the package by forming cavities in both upper and lower substrates to accommodate a semiconductor chip mounted in the lower substrate.

An aspect of the present invention features a manufacturing method of a package on package with a cavity. The method can include forming a first upper substrate cavity in one side of an upper substrate; mounting an upper semiconductor chip on the other side of the upper substrate; forming a lower substrate cavity in one side of a lower substrate; mounting a lower semiconductor chip in the lower substrate cavity formed in the lower substrate; and stacking the upper substrate above the lower substrate such that the first upper substrate cavity accommodates a part of the lower semiconductor chip.

The method can further comprise forming a second upper substrate cavity in the other side of the upper substrate; wherein, mounting the upper semiconductor chip is mounted in the second upper substrate cavity The method can further comprise forming a solder ball on the lower substrate; wherein, the stacking the upper substrate and the lower substrate are electrically combined with the solder ball.

Or, the method can include forming a hole in an upper substrate; mounting a semiconductor chip on one opening of the hole; forming a lower substrate cavity in one side of a lower substrate; mounting a lower semiconductor chip in the lower substrate cavity formed in the lower substrate; and stacking the upper substrate above the lower substrate such that the hole formed in the upper substrate accommodates a part of the lower semiconductor chip.

The method can further comprise forming a solder ball on the lower substrate; wherein, at the step (e), the upper substrate and the lower substrate are electrically combined with the solder ball.

Another aspect of the present invention features a package on package with a cavity comprise an upper substrate having a first upper substrate cavity formed in its one side; an upper semiconductor chip mounted in the other side of the upper substrate; a lower substrate having a lower substrate cavity formed in its one side and electrically combined with the upper substrate; and a lower semiconductor chip mounted in the lower substrate cavity and is partly accommodated in the first upper substrate cavity.

A second upper substrate cavity can be formed in the other side of the upper substrate, so that the upper semiconductor chip can be mounted in the second upper substrate cavity.

The first and second upper substrate cavities can be formed to face each other.

A solder ball can be placed between the upper and lower substrates to electrically combine the upper and lower substrates.

The package on package with a cavity can comprise an upper substrate in which a hole is formed; an upper semiconductor chip that is mounted on one side of the upper substrate; a lower substrate having a lower substrate cavity formed in its one side, and electrically combined with the upper substrate; and a lower semiconductor chip that is mounted in the lower substrate cavity and is partly accommodated in the hole formed in the upper substrate.

The upper semiconductor chip can be electrically connected with the other side of the upper substrate through a wire penetrating through the hole.

A solder ball can be placed between the upper and lower substrates to electrically combine the upper and lower substrates.

Additional aspects and advantages of the present general inventive concept will be set forth in part in the description which follows, and in part will be obvious from the description, or may be learned by practice of the general inventive concept.

BRIEF DESCRIPTION OF THE DRAWINGS

These and other features, aspects, and advantages of the present invention will become better understood with regard to the following description, appended claims, and accompanying drawings where:

DETAILED DESCRIPTION OF EMBODIMENTS

Hereinafter, embodiments of the invention will be described in more detail with reference to the accompanying drawings. In the description with reference to the accompanying drawings, those components are rendered the same reference number that are the same or are in correspondence regardless of the figure number, and redundant explanations are omitted.

In addition, prior to describing preferred embodiments of the present invention, the method for manufacturing a general substrate will be described first. Although the method for manufacturing a multi-layer substrate is described, the present invention is by no means restricted to the method for manufacturing a multi-layer substrate.

First, an internal circuit pattern is formed on the outside of a core layer. An inner-layer base material that meets the product specification is cut, and a predetermined internal circuit pattern is formed using a dry film and a working film. Here, the inner layer can be scrubbed, and an inner layer dry film can be laminated, and the inner layer can be exposed/developed.

Then, prior to bonding the inner layer, on which the circuit pattern is formed, to the outer layer, a brown (black) oxide process is carried out in order to strengthen the adhesion. That is, the surface of a copper foil is chemically oxidized to enhance the surface roughness such that the lamination results in better adhesion. Then, by laminating the inner-layer substrate and a prepreg, prelamination and lamination processes are carried out. Then, the laminated inner layer substrate and the prepreg are vacuum pressed. It is possible that the laminated inner layer substrate and the prepreg are hot pressed or cool pressed, instead of being vacuum pressed.

The resin and copper foil are trimmed from the corners of the panel, and an X-ray target drilling process, in which a hole is made at a target guide mark on the inner layer circuit, is carried out in preparation of a drilling process. Then, the drilling process is carried out for electric conduction between the layers of the substrate. Here, a computer numerical control (CNC) method can be used for the drilling process.

Then, the outer layer is coated with the dry film and the working film in order to form a circuit pattern, exposed to a light of a predetermined intensity for a predetermined duration, and the unirradiated areas are developed in an etching process. After examining the outer layer and measuring the scale, a solder resist exposure film is designed and manufactured. Then, a preprocess, such as brush polishing, in which the surface of copper foil is made rough such that the solder resist ink is better adhered to the substrate, is carried out. The solder resist is then coated; the solder resist is exposed using the solder resist exposure film, designed adaptively in the preceding process; the solder resist is removed in a development process; and a variety of postprocesses, including electric/final tests, are carried out.

Figure 2:
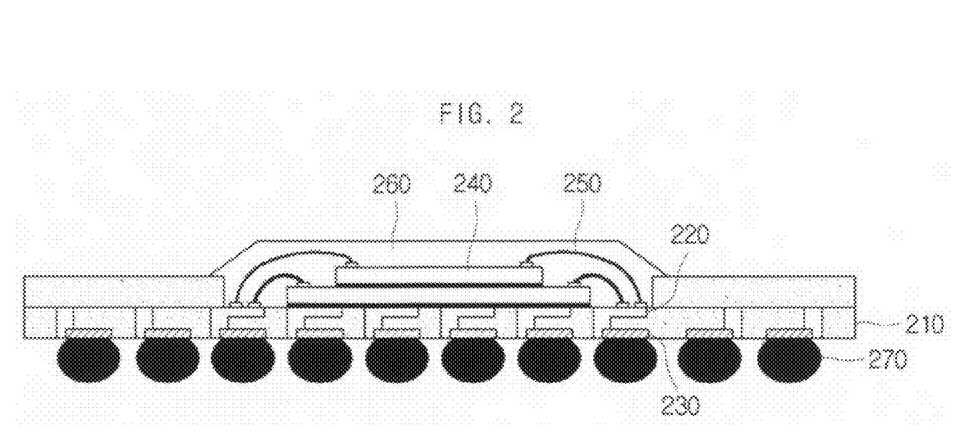
FIG. 2 is a schematic sectional view of a package on package according to an embodiment of the present invention.

FIG. 2 is a schematic sectional view of a semiconductor package, constituting a package on package, in accordance with an embodiment of the present invention. Referring to FIG. 2, the semiconductor package in accordance with the present invention comprises a core layer 210, a conductive wire 220, a metal pad 230, an integrated circuit 240, a metal wire 250, a molding part 260, and a solder ball 270.

According to the present invention, at least one integrated circuit 240 is seated and located in a cavity, which is formed on a substrate, in order to reduce the thickness of the semiconductor package. That is, the cavity is formed in the upper part of the core layer 210 of a package on package, using an insulation layer, and the integrated circuit 240 is inserted in the formed cavity. Then, the integrated circuit 240 is electrically coupled to the conductive circuit 220 and the metal pad 230, using the metal wire 250. Using a protective material, such as epoxy resin, the molding part is formed around and on top of the integrated circuit 240.

Figure 3:
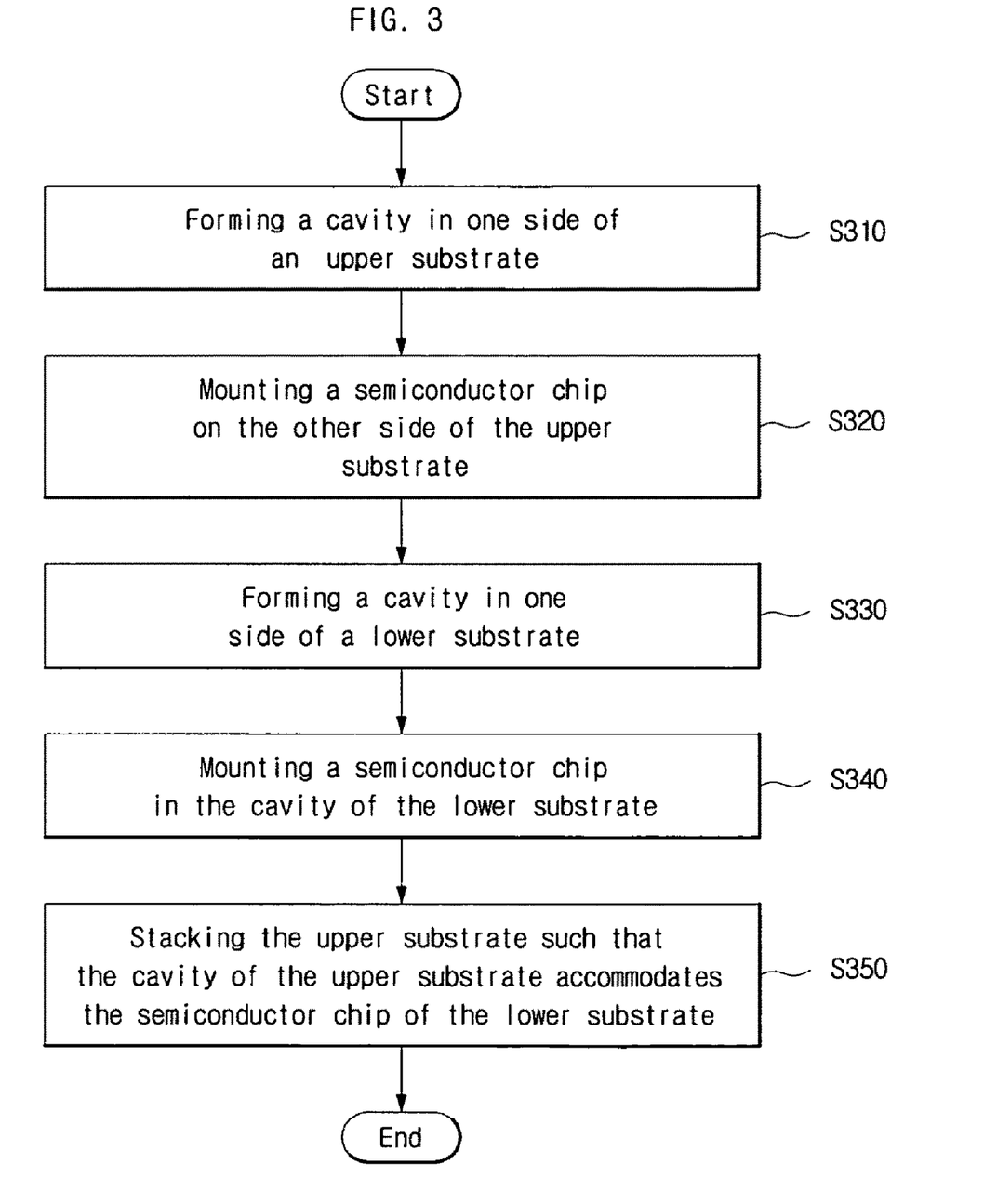
FIG. 3 is a flowchart of a manufacturing method of a package on package according to an embodiment of the present invention.

FIG. 3 is a flowchart illustrating a manufacturing method of a package on package with a cavity according to an embodiment of the present invention.

At step S310, a cavity is formed in one side of an upper substrate, so that the cavity can accommodate a semiconductor chip mounted on a lower substrate. Here, an end mill or laser is used to form the cavity having a depth and a width. The end mill is a type of a milling cutter, having an end blade and a side blade, and is widely used in milling applications such as profile milling, tracer milling, face milling, and the like. In order to fabricate a cavity, first, an object is perforated to a depth with the end blade, and then the perforated area is contoured with the side blade. Also, laser can be used for a precise processing.

Here, the depth of the cavity can be different depending on the thickness of a protecting material. For example, the cavity can be fabricated to a depth that can prevent a damage to wires formed earlier. And, the cavity has an enough width to accommodate a semiconductor chip. The cavity can be fabricated by a pattern, without separate processes, when a core layer or insulation layer is manufactured.

After forming the cavity in the upper substrate, a semiconductor chip is mounted on the other side of the upper substrate at step S320. The semiconductor chip can be mounted by a wire bonding or a flip chip bonding, etc.

After forming the upper package, a cavity is formed on one side of the lower substrate at step S330. The cavity can be formed in the same manner as described above.

At step S340, a semiconductor chip is mounted in the cavity of the lower substrate. Therefore, since the semiconductor chip is accommodated in the cavity to be mounted in the lower substrate, the thickness of the package can decrease primarily.

At step S350, the upper substrate is stacked above the lower substrate, such that the semiconductor chip of the lower substrate can be accommodated in the cavity formed in the upper substrate. That is, a lower part of the semiconductor chip of the lower substrate is accommodated in the cavity of the lower substrate, and an upper part is accommodated in the cavity of the upper substrate, thereby decreasing the overall thickness of the package efficiently.

Although in the above description, the lower substrate is formed after the upper substrate, the lower substrate can first be formed before the upper substrate. Hereinafter, the manufacturing method of a package on package with a cavity according to the present invention will be described in detail by introducing two embodiments.

Figure 4:
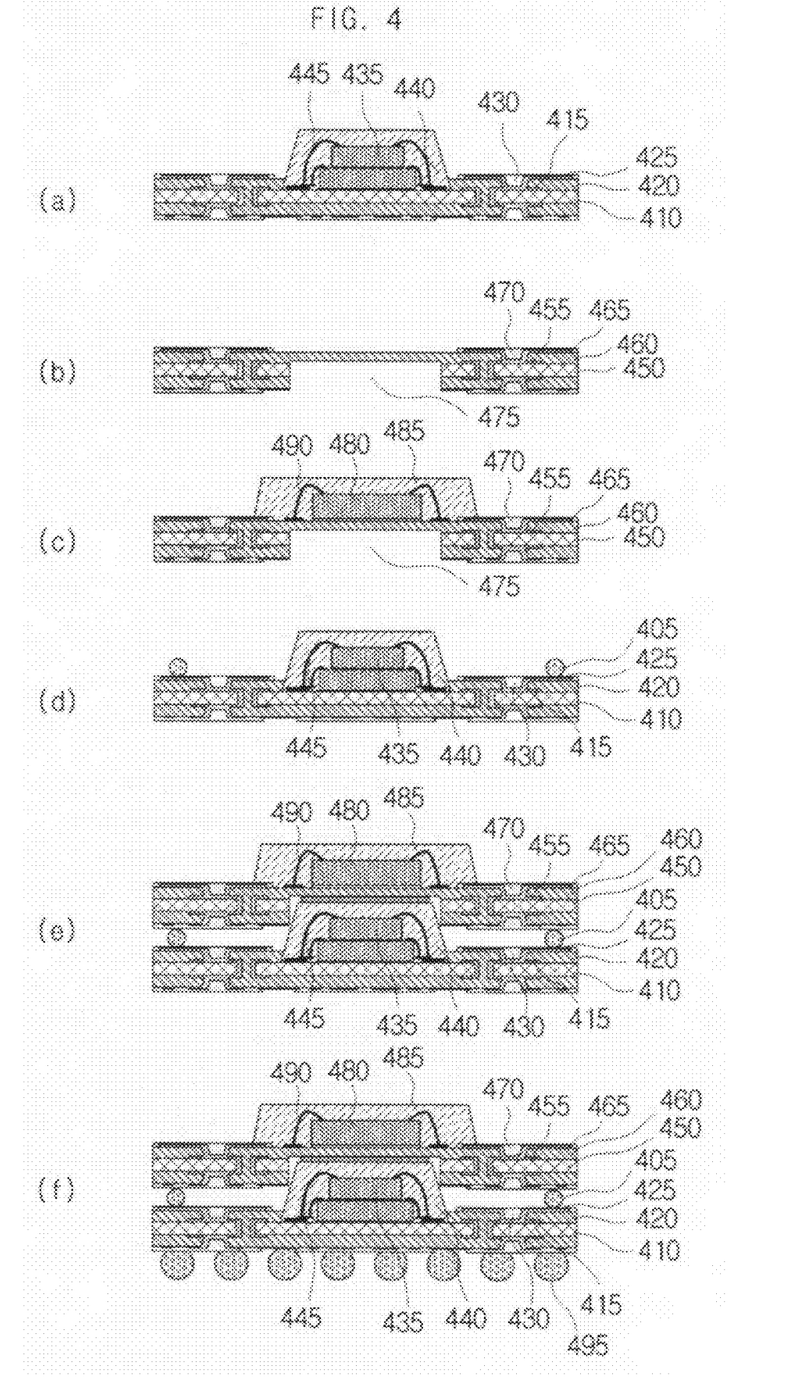
FIG. 4 illustrates a manufacturing method of a package on package according to a first embodiment of the present invention.

FIG. 4 illustrates a manufacturing method of a package on package with a cavity, according to a first embodiment of the present invention. In FIG. 4 are illustrated an upper solder ball 405, a lower substrate core layer 410, a lower substrate internal circuit 415, a lower substrate insulation layer 420, a lower substrate external circuit 425, a lower substrate photo solder resist 430, a lower semiconductor chip 435, a molding resin 440, 485, a wire 445, 490, an upper substrate core layer 450, an upper substrate internal circuit 435, an upper substrate insulation layer 460, an upper substrate external circuit 465, an upper substrate photo solder resist 470, an upper substrate cavity 475, an upper semiconductor chip 480, and a lower solder ball 495.

At step (a), a pattern for the lower substrate internal circuit 415 is formed in the lower substrate core layer 410, the lower substrate insulation layer 420 is formed to fabricate a multilayer substrate, and the lower substrate external circuit 425 is formed. Here, a cavity is formed to accommodate the lower semiconductor chip 435. Afterward, a lower package is formed through forming a conducting pathway such as a via hole; laminating the lower substrate photo solder resist 430 to protect the lower substrate circuits; mounting the lower semiconductor chip 435 in the lower substrate cavity; electrically connecting the lower semiconductor chip 435 with the lower substrate through the wire 450; and coating it with the molding resin 440.

In the above, a wire bonding was described, but a flip chip bonding can be performed as another embodiment.

At step (b), a pattern for the upper substrate internal circuit 455 is formed in the upper substrate core layer 450, the upper substrate insulation layer 460 is formed to fabricate a multi-substrate, and the upper substrate external circuit 465 is formed. The upper substrate cavity 475 can be formed by a separate process as described above.

At step (c), the upper semiconductor chip 480 is mounted on the other side where the upper substrate cavity 475 is not formed, and the upper semiconductor chip 480 is electrically connected with the upper substrate through the wire 490 and is coated with the molding resin 485, thereby forming the upper package.

At step (d), the upper solder ball 405 is formed on the lower package in order to support and electrically connect the upper package, and, at step (e), the upper package is stacked on the lower package, such that the upper substrate cavity 475 accommodates an upper portion of the lower semiconductor chip 435.

At step (f), the lower solder ball 495 for multi stack packaging is formed on the lower package below the lower surface.

Although, in the above description, the lower package is fabricated before the upper package, it is obvious to anyone of ordinary skill in the art to which the invention pertains that they can be fabricated in another order.

For example, the upper package can first be fabricated before the lower package. Otherwise, the upper semiconductor chip 480 can later be mounted after the upper substrate is stacked on the lower package.

In addition, in the upper package can be formed another cavity (not shown) to accommodate the upper semiconductor chip 480. More specifically, the upper package can have a second upper substrate cavity in the other side, where the upper substrate cavity 475 is not formed. Here, the upper substrate cavity 475 can be referred to as the first upper substrate cavity in order to distinguish from the second upper substrate cavity. The second upper substrate cavity can be formed to face the first upper substrate cavity. In this case, the thickness of the insulation layer 460 or upper substrate core layer 450 between the first and second upper substrate cavities can be determined considering the size of the upper lower semiconductor chip 480 or the lower semiconductor chip 435, and the thickness of the upper or lower package.

Figure 5:
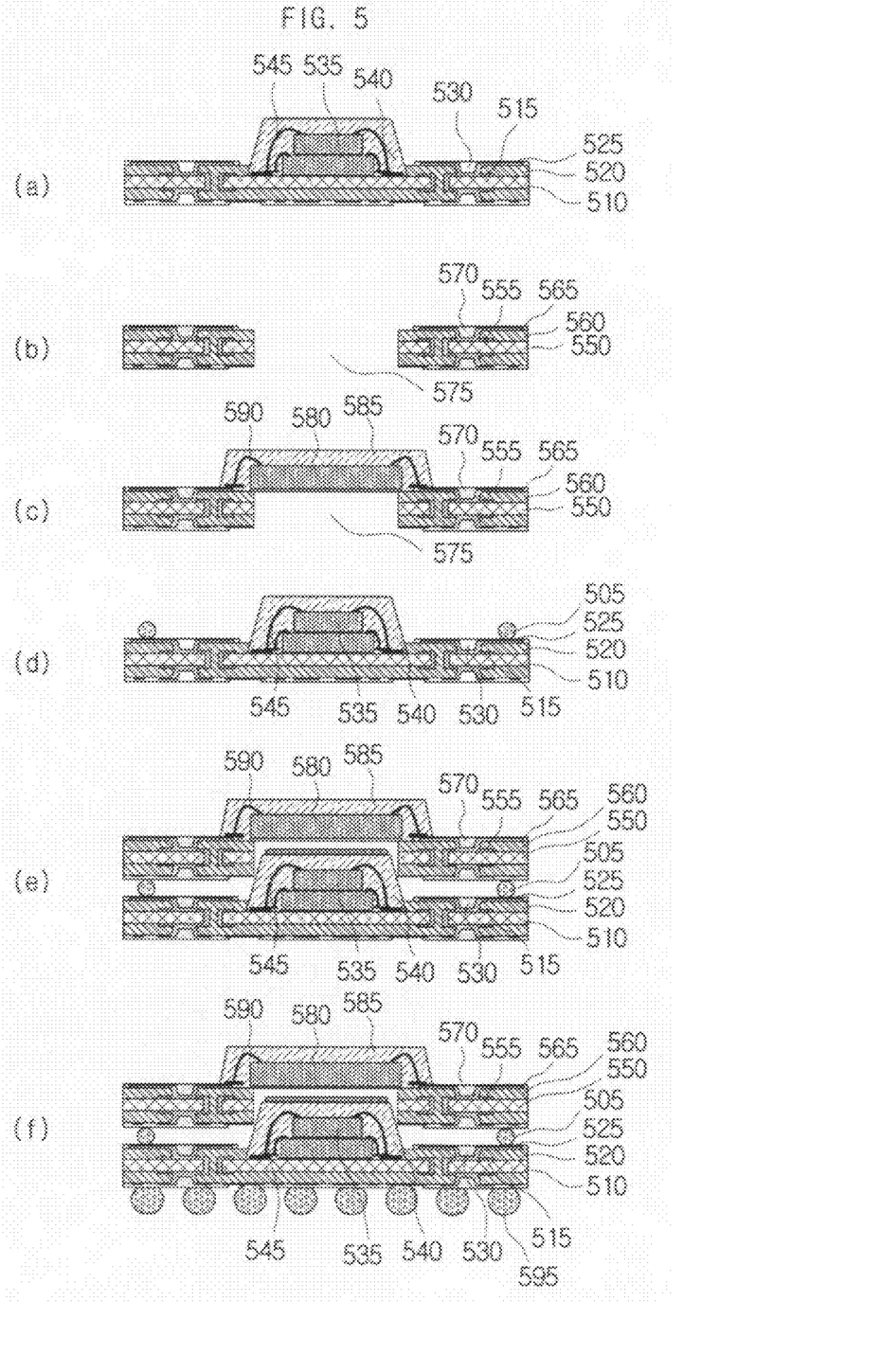
FIG. 5 illustrates a manufacturing method of a package on package according to a second embodiment of the present invention.

FIG. 5 illustrates a manufacturing method of a package on package having a hole in an upper substrate, according to a second embodiment of the present invention. In FIG. 5 are illustrated an upper solder ball 505, a lower substrate core layer 510, a lower substrate internal circuit 515, a lower substrate insulation layer 520, a lower substrate external circuit 525, a lower substrate photo solder resist 530, a lower semiconductor chip 535, a molding resin 540, 585, a wire 545, 590, an upper substrate core layer 550, an upper substrate internal circuit 555, an upper substrate insulation layer 560, an upper substrate external circuit 565, an upper substrate photo solder resist 570, a hole 575, an upper semiconductor chip 580, and a lower solder ball 595.

The description below emphasizes differences from the first embodiment.

In the upper package, the hole 575 is formed instead of the cavity. Here, the hole 575 is as large as to accommodate the upper semiconductor chip 535 and also to allow the lower semiconductor chip 580 to be mounted thereon.

The upper semiconductor chip 580 is mounted on one opening of the hole 575 of the upper package. Here, the upper package can be thinner by accommodating a part the upper semiconductor chip 580 in the hole 575.

In addition, the upper semiconductor chip 580 can be wire-bonded through a wire penetrating the hole 575 to be connected with other side of the upper package.

Figure 6:
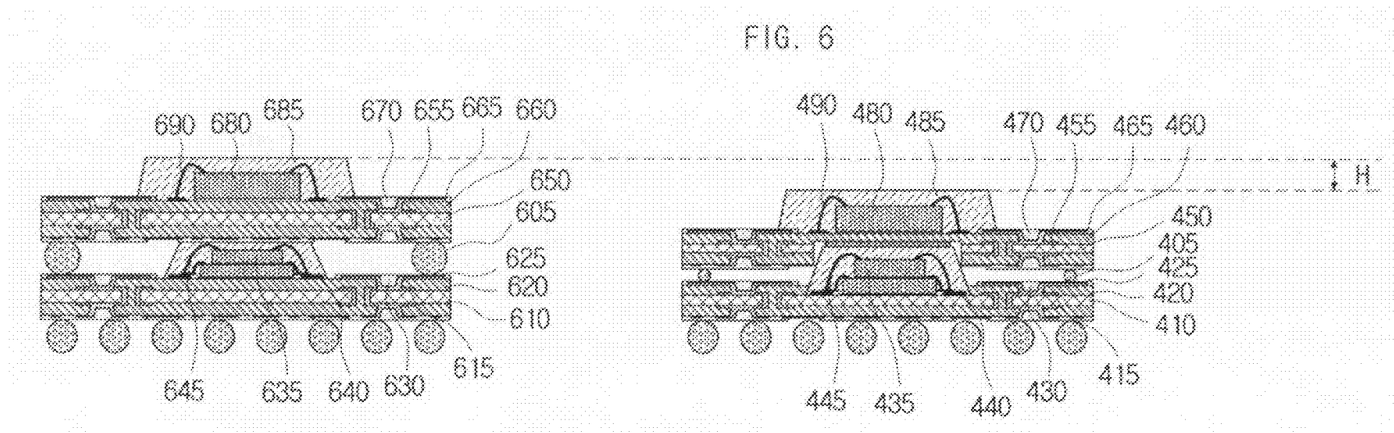
FIG. 6 illustrates sectional views to compare the thickness of a package on package according to an embodiment of the present invention with the thickness of a package on package according to the prior art.

FIG. 6 illustrates sectional views to compare the thickness of a package on package according to an embodiment of the present invention with the thickness of a package on package according to a prior art. Referring to FIG. 6, the package on package according to the present invention has cavities to accommodate the lower semiconductor chip 435 in both the upper and lower packages, thereby decreasing the overall thickness of the package by H. The solder ball also becomes smaller, and in turn a bonding pad and a land also can be smaller, so that a high density pattern can be formed.

While the invention has been described with reference to the disclosed embodiments, it is to be appreciated that those skilled in the art can change or modify the embodiments without departing from the scope and spirit of the invention or its equivalents as stated below in the claims.

What is claimed is:

1. A method for manufacturing a package on package with a cavity, the method comprising:
    forming a first upper substrate cavity in a lower side of an upper substrate;
    forming a second upper substrate cavity in an upper side of the upper substrate;
    mounting an upper semiconductor chip in the second upper substrate cavity of the upper substrate;
    forming a lower substrate cavity in an upper side of a lower substrate;
    mounting a lower semiconductor chip in the lower substrate cavity formed in the lower substrate such that a lower portion of the lower semiconductor chip is accommodated in the lower substrate cavity; and
    stacking the upper substrate above the lower substrate such that the first upper substrate cavity accommodates a part of the lower semiconductor chip.

2. A method for manufacturing a package on package with a cavity, the method comprising:
    forming a hole in an upper substrate such that the hole penetrates the upper substrate;
    mounting a semiconductor chip on one opening of the hole formed in an upper side of the upper substrate;
    forming a lower substrate cavity in an upper side of a lower substrate;
    mounting a lower semiconductor chip in the lower substrate cavity formed in the lower substrate such that a lower portion of the lower semiconductor chip is accommodated in the lower substrate cavity; and
    stacking the upper substrate above the lower substrate such that the hole formed in the upper substrate accommodates a part of the lower semiconductor chip.

3. The method of claim 1, further comprising forming a solder ball on the lower substrate such that the upper substrate and the lower substrate are electrically combined with the solder ball.

4. The method of claim 2, further comprising forming a solder ball on the lower substrate such that the upper substrate and the lower substrate are electrically combined with the solder ball.

5. A method for manufacturing a package on package with a cavity, the method comprising:
    forming a first upper substrate cavity in a lower side of an upper substrate;
    mounting an upper semiconductor chip on an upper side of the upper substrate;
    forming a lower substrate cavity in an upper side of a lower substrate;
    mounting a lower semiconductor chip in the lower substrate cavity formed in the lower substrate such that a lower portion of the lower semiconductor chip is accommodated in the lower substrate cavity; and
    stacking the upper substrate above the lower substrate such that the first upper substrate cavity accommodates a part of the lower semiconductor chip.

6. The method of claim 5, further comprising forming a solder ball on the lower substrate such that the upper substrate and the lower substrate are electrically combined with the solder ball.

* * * * *